(12) United States Patent
Iwata et al.

(10) Patent No.: US 8,415,724 B2
(45) Date of Patent: Apr. 9, 2013

(54) PHOTOELECTRIC CONVERSION APPARATUS AND IMAGING SYSTEM USING PHOTOELECTRIC CONVERSION APPARATUS

(75) Inventors: Koichiro Iwata, Kawasaki (JP);
Hidekazu Takahashi, Zama (JP)

(73) Assignee: Canon Kabushiki Kaisha, Tokyo (JP)

( * ) Notice: Subject to any disclaimer, the term of this patent is extended or adjusted under 35 U.S.C. 154(b) by 84 days.

(21) Appl. No.: 13/186,133

(22) Filed: Jul. 19, 2011

(65) Prior Publication Data

US 2011/0272750 A1 Nov. 10, 2011

Related U.S. Application Data

(63) Continuation of application No. 12/370,015, filed on Feb. 12, 2009, now Pat. No. 8,013,369.

(30) Foreign Application Priority Data

Feb. 27, 2008 (JP) ................. 2008-046241

(51) Int. Cl.
*H01L 31/062* (2012.01)
(52) U.S. Cl. .......... 257/290; 257/E27.131; 257/E27.132
(58) Field of Classification Search .......... 257/290, 257/291, 292, 369, 370, 444, E27.132, E27.131
See application file for complete search history.

(56) References Cited

U.S. PATENT DOCUMENTS

| | | | |
|---|---|---|---|
| 6,973,265 B2 | 12/2005 | Takahashi | 396/121 |
| 7,560,754 B2 | 7/2009 | Abe et al. | 257/222 |
| 7,561,199 B2 | 7/2009 | Noda et al. | 348/308 |
| 7,830,433 B2 | 11/2010 | Fujioka et al. | 348/294 |
| 2001/0012133 A1 | 8/2001 | Yoneda et al. | 358/482 |
| 2005/0116251 A1 | 6/2005 | Abe et al. | 257/146 |
| 2006/0238633 A1 | 10/2006 | Kinugasa et al. | 348/300 |
| 2007/0145423 A1 | 6/2007 | Han | 257/233 |
| 2008/0029793 A1 | 2/2008 | Watanabe et al. | 257/291 |
| 2008/0036890 A1 | 2/2008 | Yamashita et al. | 348/308 |
| 2008/0211950 A1 | 9/2008 | Ono et al. | 348/308 |
| 2009/0015699 A1 | 1/2009 | Watanabe et al. | 348/308 |
| 2009/0122172 A1 | 5/2009 | Iwata et al. | 348/302 |
| 2009/0167914 A1 | 7/2009 | Itano et al. | 348/301 |
| 2009/0200449 A1 | 8/2009 | Iwata et al. | 250/206 |
| 2009/0256937 A1 | 10/2009 | Noda et al. | 348/300 |

FOREIGN PATENT DOCUMENTS

| | | |
|---|---|---|
| EP | 1 801 876 A1 | 6/2007 |
| JP | 2001-052360 A | 2/2001 |
| JP | 2001-230400 A | 8/2001 |
| JP | 2005-1452251 A | 6/2005 |
| JP | 2006-059995 A | 3/2006 |
| JP | 2006-073567 A | 3/2006 |
| JP | 2006-086407 A | 3/2006 |
| JP | 2006-100620 A | 4/2006 |
| JP | 2006-269546 A | 10/2006 |
| JP | 2007-180538 A | 7/2007 |

*Primary Examiner* — David Vu
(74) *Attorney, Agent, or Firm* — Fitzpatrick, Cella, Harper & Scinto

(57) ABSTRACT

A photoelectric conversion apparatus includes a photoelectric conversion unit with a semiconductor region of a first conduction type, an amplifying transistor, and a contact. The contact supplies, via a semiconductor region of a second conduction type arranged along a side surface and a bottom surface of an element isolation region, a reference voltage to the semiconductor region of the second conduction-type arranged below source and drain regions of the amplifying transistor in a region below a gate electrode of the amplifying transistor.

6 Claims, 8 Drawing Sheets

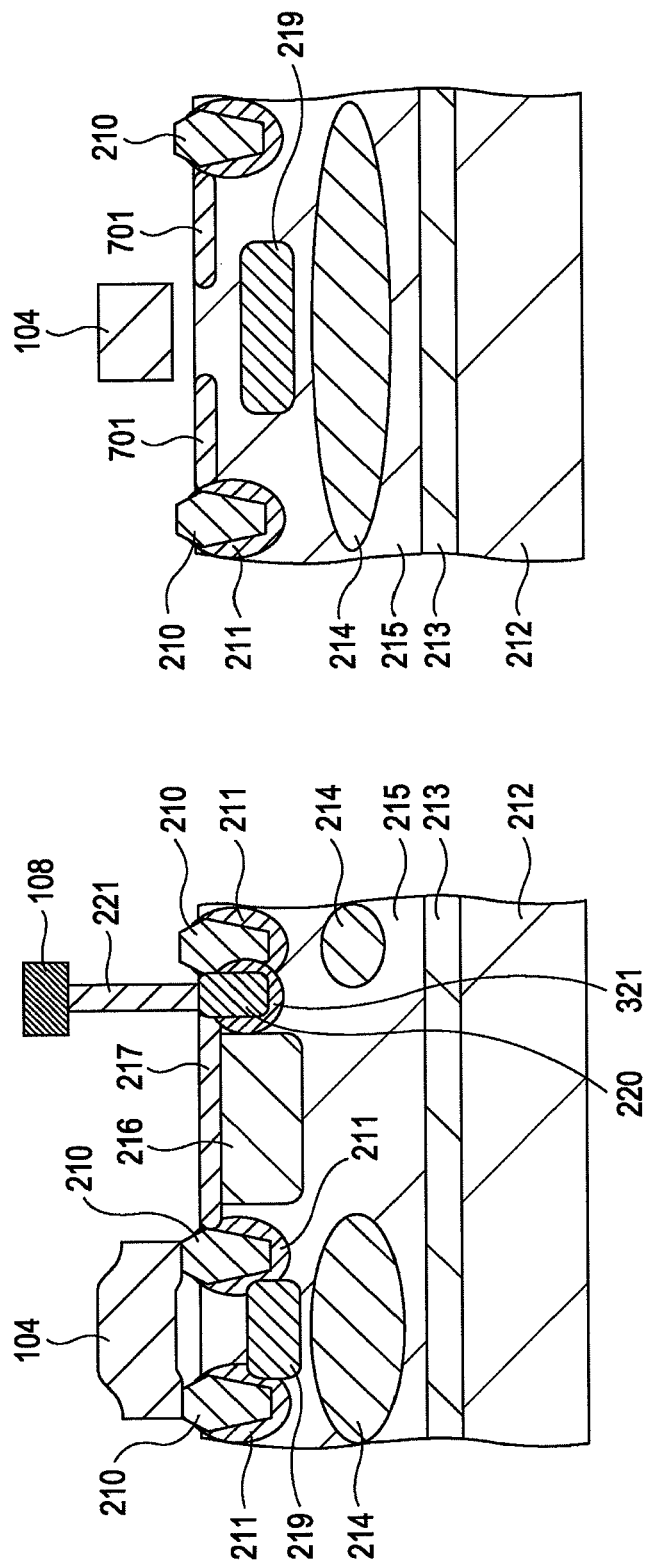

PHOTOELECTRIC CONVERSION APPARATUS AND IMAGING SYSTEM USING PHOTOELECTRIC CONVERSION APPARATUS

CROSS REFERENCE TO RELATED APPLICATION

This application is a continuation of U.S. application Ser. No. 12/370,015 filed on Feb. 12, 2009, the entire disclosure of which is incorporated by reference herein.

BACKGROUND OF THE INVENTION

1. Field of the Invention

The present invention relates to an amplifying photoelectric conversion apparatus.

2. Description of the Related Art

As photoelectric conversion apparatuses have come to have a larger number of pixels in recent years, pixels have become smaller or finer. When pixels become finer, because the amount of light that enters each pixel is decreased, sensitivity is decreased and image quality is deteriorated in the apparatuses.

Japanese Patent Laid-Open No. 2001-053260 discloses a configuration of a photoelectric conversion apparatus in which a photoelectric conversion unit is formed in an N-type semiconductor region surrounded by a P-type semiconductor region, thereby improving sensitivity.

Japanese Patent Laid-Open No. 2005-142251 discloses a configuration in which a contact is provided for each pixel as means for suppressing shading due to variations in the well potential of the pixel. By providing a contact for each pixel, it is not necessary to allocate a place in which a contact is to be arranged in a chip, making it possible to suppress increasing the chip area, and making it possible to suppress shading without disturbing pixel arrangement pitches.

In the pixel structure disclosed in Japanese Patent Laid-Open No. 2001-053260, there is also a case in which signals from pixels may vary due to variations in the well potential for each pixel. However, studies have not been sufficiently made on variations in the well potential in such a pixel structure.

SUMMARY OF THE INVENTION

The present invention provides a photoelectric conversion apparatus including: a semiconductor substrate of a first conduction type; a first semiconductor region of the first conduction type; a second semiconductor region of a second conduction type, which isolates the semiconductor substrate and the first semiconductor region from each other; a pixel unit in which pixels are arranged two-dimensionally, each pixel including a photoelectric conversion unit including a third semiconductor region of the first conduction type having an impurity concentration higher than the first semiconductor region and a fourth semiconductor region of the second conduction type, an amplifying transistor for reading a signal of the photoelectric conversion unit, and an element isolation region that electrically isolates an active region where the photoelectric conversion unit is arranged from an active region where the amplifying transistor is arranged; a fifth semiconductor region of the second conduction type, which is arranged in the first semiconductor region along the side surface and the bottom surface of the element isolation region; and a sixth semiconductor region of the second conduction type, which is arranged between the source and drain regions of the amplifying transistor and the second semiconductor region, in a region below the gate electrode of the amplifying transistor, wherein a contact for supplying a reference voltage to the sixth semiconductor region via the fifth semiconductor region is arranged in the active region where the photoelectric conversion unit is arranged, wherein the contact includes a plug for supplying the reference voltage, and a seventh semiconductor region of the second conduction type, to which the plug is electrically connected, and wherein an eighth semiconductor region of the second conduction type, which has an impurity concentration lower than the seventh semiconductor region, is arranged between the seventh semiconductor region and the third semiconductor region.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

FIG. 4A is a cross-sectional view of a pixel of the photoelectric conversion apparatus according to the first embodiment of the present invention.

FIG. 4B is a cross-sectional view of a pixel of the photoelectric conversion apparatus according to the first embodiment of the present invention.

Figure 1:
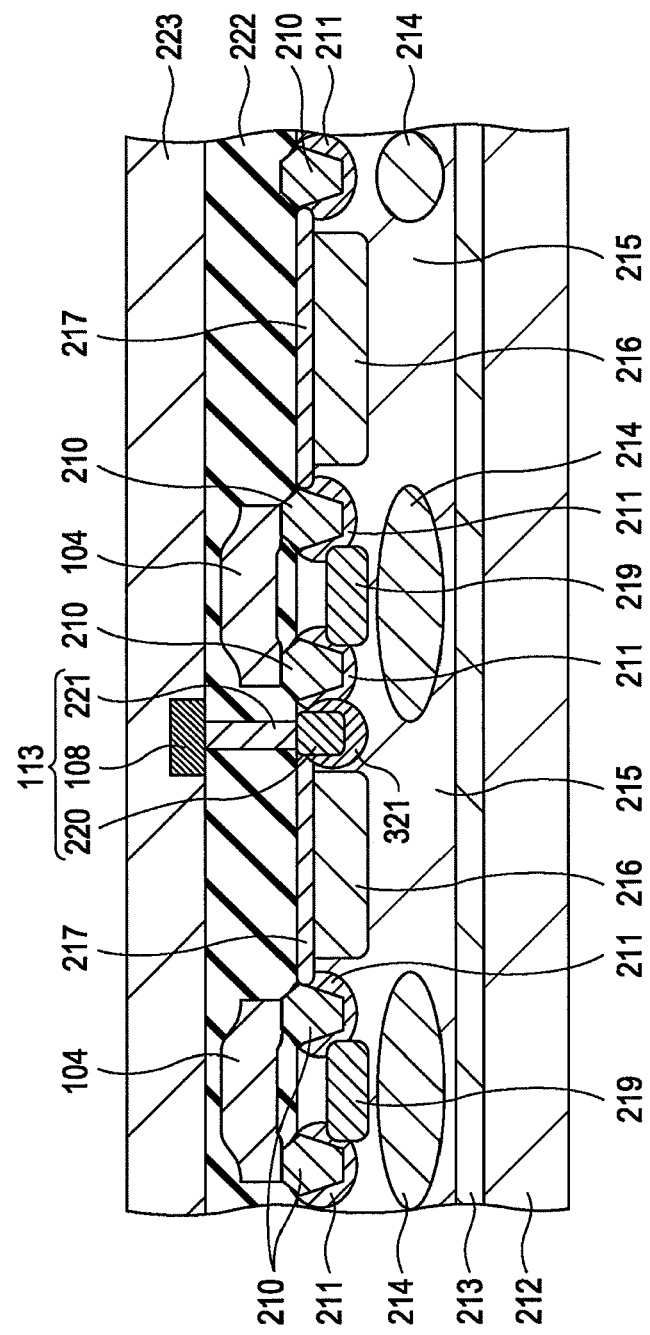
FIG. 1 is a cross-sectional view of a pixel of a photoelectric conversion apparatus according to a first embodiment of the present invention.

The accompanying drawings, which are incorporated in and constitute a part of the specification, illustrate embodiments of the invention and, together with the description, serve to explain principles of aspects of the invention.

DETAILED DESCRIPTION OF THE PREFERRED EMBODIMENTS

In a photoelectric conversion apparatus according to an aspect of the present invention, a semiconductor region, which has a high concentration (i.e., a high carrier concentration), for supplying a reference voltage to a P well arranged in a region below a channel of an amplifying MOS transistor, is arranged in an active region in which a photoelectric conversion unit is arranged. Around the high-concentration semiconductor region, a semiconductor region which is of the same conduction type as the high-concentration semiconductor region and which has a low concentration is arranged. When an electrode (e.g., a plug) is connected to the high-concentration semiconductor region and a reference voltage is supplied thereto, the reference voltage is supplied to the P well arranged in a region below the gate electrode of the amplifying transistor. With such a configuration, it is possible to reduce shading and non-uniformity in the saturated output while the layout symmetry of pixels is maintained. Furthermore, it is possible to moderate an electric field of the interface between the semiconductor region for storing the electric charge of a signal and the high-concentration semiconductor region, which constitute a photoelectric conversion element unit, and consequently it is possible to suppress a leakage current.

Hereinafter, a configuration including a plug, and a high-concentration semiconductor region that is electrically connected to the plug, the configuration being used to set the electric potential of a well, will be referred to as a "well contact". A semiconductor substrate, which is a material substrate, is referred to as a "substrate". An active region is a semiconductor region, which is divided by an element isolation region, formed by local oxidation of silicon (LOCOS) or the like, in which various elements are formed, and which may form part of the elements. For example, the active region is a region in which a drain region and a source region are formed in a transistor. The direction from the main surface of the semiconductor substrate to the inside of the substrate is assumed to be a downward direction, and the opposite thereof is assumed to be an upward direction. The outer edge of the semiconductor region is at a position at which the concentration of an impurity that determines the conduction type of the semiconductor region becomes equal to the concentration of an impurity that determines the conduction type of the semiconductor region in the surrounding thereof (for example, the position at which the net concentration becomes zero). Regarding the arrangement relationship between semiconductor regions, up and down are defined on the basis of the position of the concentration center in the depth direction of the semiconductor region, and they may partially overlap with each other.

Although the configuration of the present invention will be described with reference to embodiments, it is to be understood that the invention is not limited to the disclosed embodiments. Various modifications and combinations are possible without departing from the spirit and scope of the present invention. For example, the conduction type of the semiconductor region will be described below in the following embodiments for a case in which the electric charge forming a signal is an electron. In the case that holes are used as the electric charge forming a signal, the conduction type of each semiconductor region needs only to be reversed.

First Embodiment

Figure 6:
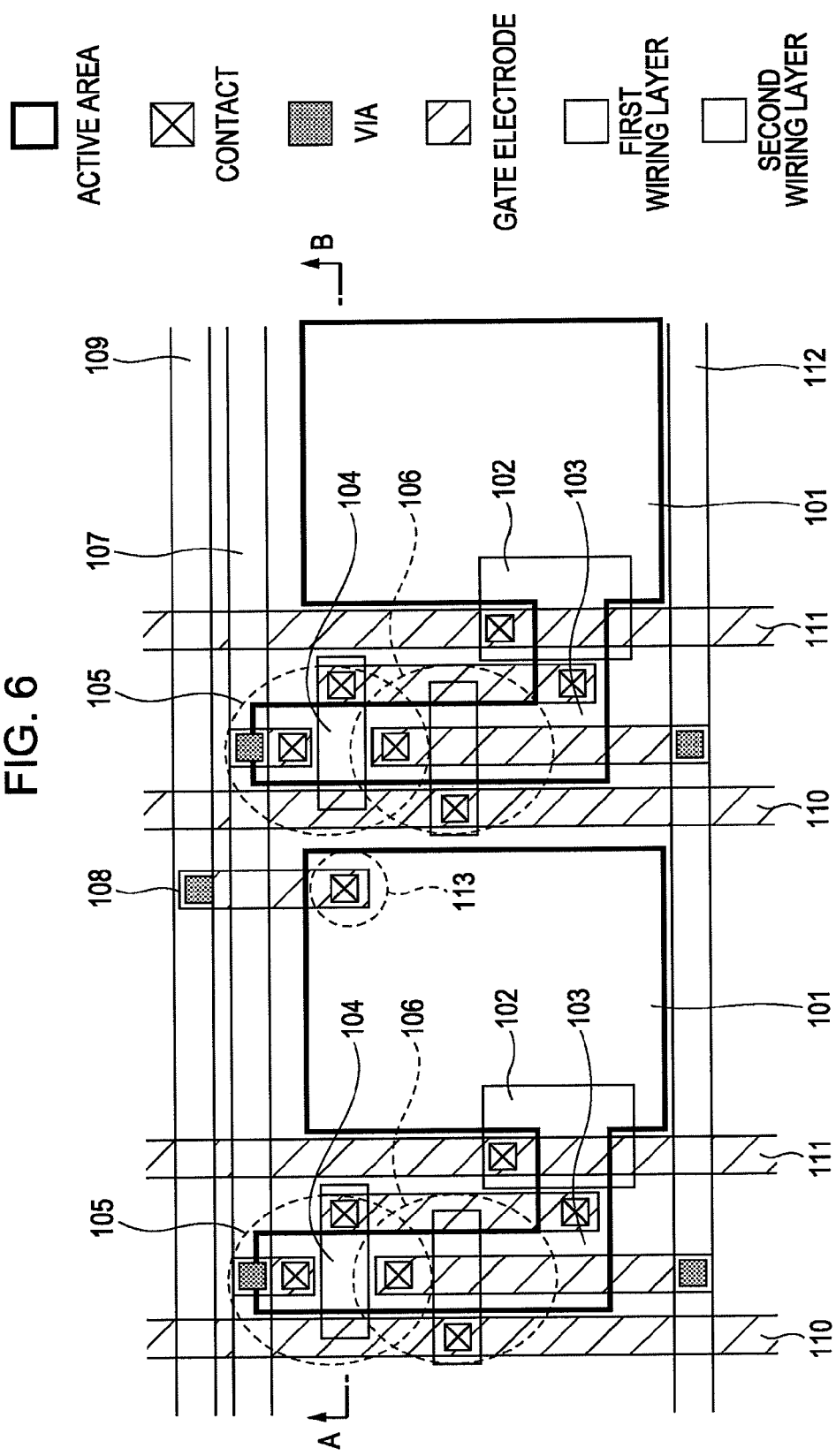
FIG. 6 is a plan view of a pixel of an MOS photoelectric conversion apparatus.
Figure 7:
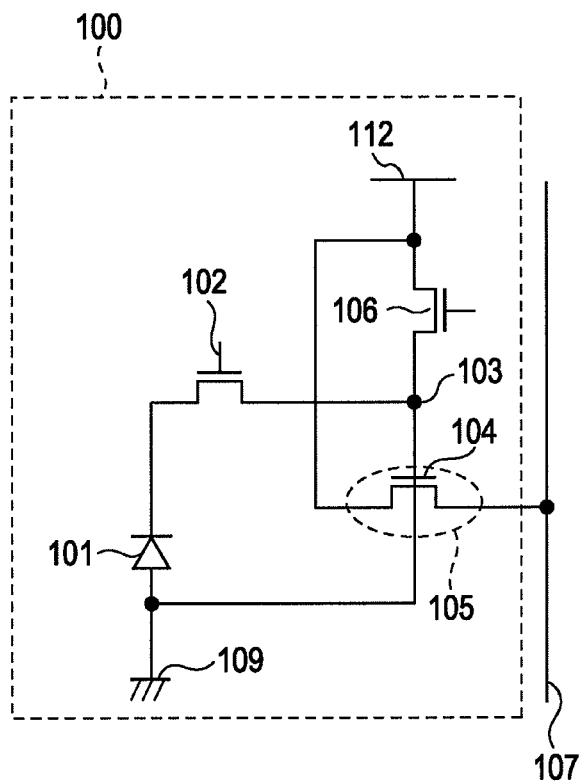
FIG. 7 is an equivalent circuit diagram of a pixel of an MOS photoelectric conversion apparatus.

An equivalent circuit of a pixel according to the present embodiment is shown in FIG. 7. A plan view in which two pixels each corresponding to that of FIG. 7, arranged side by side, is shown in FIG. 6. Here, a description will be given of a case in which a signal charge is an electron and a MOS transistor is of an N-type.

Shown in FIG. 7 are a photodiode 101, which is a photoelectric conversion unit, a gate electrode 102 of a transferring MOS transistor, and a floating diffusion region 103 (hereinafter referred to as an "FD"). Reference numeral 105 denotes an amplifying MOS transistor, and reference numeral 104 denotes the gate electrode of the amplifying MOS transistor 105. Reference numeral 106 denotes a resetting MOS transistor. The drain of the resetting MOS transistor 106 and the drain of the amplifying MOS transistor 105 are connected to a power-supply line 112. The source of the resetting MOS transistor 106, the FD 103, and the gate electrode 104 of the amplifying MOS transistor 105 are electrically connected to one another. Reference numeral 109 denotes a GND line with a ground potential (GND). A pixel 100 having at least one such photoelectric conversion unit is set as one pixel. A plurality of pixels 100 are connected to a plurality of signal lines 107, and the plurality of signal lines 107 are arranged, thereby forming a pixel unit in which pixels are arranged two-dimensionally.

The operations of the pixel 100 are as described below. Electric charge generated by a photoelectric conversion unit 101 is transferred to the FD 103 by means of the gate electrode 102 of the transferring MOS transistor. The FD 103 functions as an input unit of the amplifying MOS transistor 105. A signal based on the electric charge of the FD 103 is output to the signal line 107 by the amplifying MOS transistor 105. The resetting MOS transistor 106 discharges electric charge in the FD 103 and the gate electrode 104 of the amplifying MOS transistor 105 so as to set to a predetermined potential (reset electric potential). Of course, the structure is not limited to such a pixel structure, and an amplifying transistor may be shared among a plurality of photoelectric conversion units.

FIG. 6 is a plan view in which two pixels 100 are arranged. Components identical to those described in FIG. 7 are designated with the same reference numerals, and accordingly, detailed descriptions thereof are omitted.

In FIG. 6, a contact is a connection portion between an active region and a gate electrode, a connection portion between a gate electrode and a wire, or a connection portion between an active region and a wiring layer. A via is a connection portion between a contact and a wire or a connection portion between wires. A first wiring layer and a second wiring layer are arranged in different layers, each of which is formed of a plurality of wires.

A driving line 110 supplies pulses for driving the resetting MOS transistor 106. Reference numeral 111 denotes a driving line of the transferring MOS transistor. Reference numeral 113 denotes a contact for supplying a reference voltage to a well. This reference voltage is, for example, a ground potential (GND), which is supplied from the GND line 109 formed in the second wiring layer via the via and a wire 108 of the first wiring layer to the contact 113. This contact 113 allows variations in the electric potential of the well arranged in a region below the amplifying MOS transistor 105 to be reduced.

The cross-sectional structure of the contact 113 will be described with reference to FIG. 1. FIG. 1 shows a cross section taken along the line AB in FIG. 6. The driving line 110 of the resetting MOS transistor 106, the driving line 111 of the transferring MOS transistor, gate insulating film(s) of the transistor(s), and the like are omitted.

In FIG. 1, reference numeral 212 denotes a semiconductor substrate (or semiconductor region) of a first conduction-type. Reference numeral 215 denotes a semiconductor region (first semiconductor region) of the first conduction-type. Reference numeral 213 denotes a semiconductor region (second semiconductor region) of a second conduction-type. The first semiconductor region 215 is a semiconductor region formed on an epitaxial layer formed on the substrate 212 or within the substrate 212. The second semiconductor region 213 electrically isolates the first semiconductor region 215 from the semiconductor substrate 212. At this point, a predetermined voltage, such as a ground voltage, is supplied to the second semiconductor region 213 by means of a contact provided in the outer periphery of the pixel unit. Here, the outer periphery of the pixel unit will be described. The pixel unit refers to the entire region in which a plurality of pixels are arranged, and the outer periphery thereof refers to a boundary portion between the pixel unit and a peripheral circuit region or inside of the peripheral circuit region. An element isolation region 210 is used to isolate active regions. In the present embodiment, STI (shallow trench isolation) is used, but LOCOS or another structure may be used. Reference numeral 211 denotes a semiconductor region (fifth semiconductor region) of the second conduction-type, which is arranged on the side surface and the bottom surface of the element isolation region 210 and is also arranged in the first semiconductor region 215. The fifth semiconductor region 211 should preferably be arranged so as to surround the element isolation region 210. The fifth semiconductor region 211 makes it possible to suppress the generation of a channel below the element isolation region 210. An isolation semiconductor region 214 is a semiconductor region of the second conduction-type, which is used to isolate active regions of adjacent pixels or elements. If it is only necessary to form a potential barrier for electrons that are signal electric charges, the isolation semiconductor region 214 may be depleted. Reference numeral 216 denotes a semiconductor region (third semiconductor region) of the first conduction type forming part of the photoelectric conversion unit, the third semiconductor region 216 having an impurity concentration higher than that of the first semiconductor region 215 and storing electric charge generated by photoelectric conversion. A semiconductor region 217 is a semiconductor region (fourth semiconductor region) of the second conduction-type, which is arranged on the surface of the third semiconductor region 216. The under surface of the fourth semiconductor region 217 and the upper surface of the third semiconductor region 216 form a PN junction interface. The fourth semiconductor region 217 is a conduction-type semiconductor region differing from the third semiconductor region 216, and the impurity concentration thereof is set higher than that of the third semiconductor region 216. The fourth semiconductor region 217 makes it possible to increase the reduction of dark current resulting from dangling bonds at the interface between, for example, silicon and a silicon dioxide film on the surface of the photoelectric conversion unit. The fourth semiconductor region 217 and the fifth semiconductor region 211 are arranged in such a manner as to be electrically connected to each other. The PN junction between the first conduction-type semiconductor regions 216 and 215 and the second conduction-type semiconductor regions 217, 211, 213, and 214 functions as a photoelectric conversion unit.

Next, a semiconductor region 219 will be described. The semiconductor region 219 is a semiconductor region (sixth semiconductor region) of the second conduction type, which is arranged at least in a region below the gate electrode (channel region) of an amplifying MOS transistor. The sixth semiconductor region 219 is arranged at a depth equal to the region below the source and drain regions of the amplifying MOS transistor or deeper than that. The sixth semiconductor region 219 can function as an adjustment of a threshold value, as a potential barrier, as a punch through stopper, or as a back gate of an amplifying MOS transistor. Here, the arrangement of the sixth semiconductor region 219 will be described with reference to FIGS. 4A and 4B. FIG. 4A shows part (for one pixel) of the cross-sectional view of FIG. 1. FIG. 4B shows a cross-sectional view of an amplifying MOS transistor (e.g., 105) in a direction intersecting at right angles to the line AB shown in FIG. 6. In FIG. 4B, for example, a contact is omitted. Here, the sixth semiconductor region 219 is arranged at least between the source and drain regions and the second semiconductor region 213, which is a region below the gate 104 of the amplifying MOS transistor 105.

The electric potential of the sixth semiconductor region 219 is set (fixed) by the contact 113. The contact 113 is the entire connection portion where a semiconductor region 220 (seventh semiconductor region) of the second conduction type, a plug 221, and the wiring 108 are located. The plug 221 is made of a conductor, such as a metal, arranged on the semiconductor region 220 (seventh semiconductor region) and in an insulation film 222 on the semiconductor substrate 212. The contact 113 supplies at least a reference voltage to the sixth semiconductor region 219 via the fifth semiconductor region 211.

Here, a semiconductor region 321 (eighth semiconductor region) of the second conduction-type is arranged between the seventh semiconductor region 220 and the third semiconductor region 216 forming part of the photoelectric conversion unit. The eighth semiconductor region 321 has an impurity concentration lower than that of the seventh semiconductor region 220. Also, the eighth semiconductor region 321 has an impurity concentration lower than that of the fourth semiconductor region 217. It may be said that the third semiconductor region 216 and the seventh semiconductor region 220 form a PN junction via the eighth semiconductor region 321. With such a configuration, it is possible to reduce leakage current in the photoelectric conversion unit.

Next, shading and leakage current will be described in detail. The electric potential of the sixth semiconductor region 219 varies due to driving pulses and outputs of pixels. Because the electric potential of the sixth semiconductor region 219 exerts an influence on the back gate of the amplifying MOS transistor 105 and affects the output, the output of the amplifying MOS transistor 105 also varies due to variations in the electric potential of the sixth semiconductor region 219. Furthermore, because the sixth semiconductor region 219 is capacitively coupled to the source or drain region of the amplifying MOS transistor 105, the variation in the electric potential of the sixth semiconductor region 219 propagates to the electric potential of the source or drain region of the amplifying MOS transistor 105, exerting an influence on the output. In such a case, if the amount of the electric potential variation of the sixth semiconductor region 219 or the time until the variations are subsided (which depends on the time constant) differ according to the position of each pixel in the pixel unit, output variations of the amplifying MOS transistor 105 differ according to the position of the pixel unit. This is referred to as a shading phenomenon.

In order to suppress such a shading phenomenon, it is preferable that the electric potential of the sixth semiconductor region 219, which exerts an influence on the back gate of the amplifying MOS transistor 105, be fixed. That is, a configuration for setting the sixth semiconductor region 219 to a desired electric potential with a low impedance is necessary. However, the desire for a large number of pixels and miniaturization demand that pixel pitches be reduced. If a contact is simply provided, problems may occur in that pixel pitches become larger, and the symmetry of the element layout of pixels is disturbed. Accordingly, in the present embodiment, the contact 113 is arranged in an active region where the photoelectric conversion unit is arranged. With such a configuration, it is possible to set the electric potential of the sixth semiconductor region 219 at a desired electric potential while the symmetry of the element layout of the pixels is maintained. Here, the sixth semiconductor region 219 may be arranged over a region lower than the channel region of another MOS transistor within the pixel. In that case, the reference voltage supplied via the contact 113 enables an influence exerted on the back gate of the other MOS transistor 105 to be reduced.

Next, leakage current will be described. In a case where a PN junction is directly formed by the first conduction-type third semiconductor region 216 and the second conduction-type seventh semiconductor region 220, because both the semiconductor regions have a high impurity concentration, an electric field to be applied on the PN junction interface is necessarily higher. As the electric field in the PN junction interface becomes higher, leakage current becomes larger, with the result that the amount of noise is increased.

In comparison, the second conduction-type eighth semiconductor region 321, having an impurity concentration lower than that of the seventh semiconductor region 220, is arranged between the first conduction-type third semiconductor region 216 and the second conduction-type seventh semiconductor region 220. As a result of the eighth semiconductor region 321 being thus arranged, a PN junction formed by semiconductor regions having a high concentration and a low concentration rather than a PN junction formed by semiconductor regions having only a high concentration is formed, and an electric field applied to the PN junction is moderated. As a result of the electric field applied to the PN junction being moderated, it is possible to reduce leakage current and consequently is possible to suppress noise caused by leakage current.

The eighth semiconductor region 321 is formed by decreasing the amount of dosing in ion implantation to less than that of the seventh semiconductor region 220. In the case that ion implantation is to be performed by using the same mask as that of the seventh semiconductor region 220, ion seeds having a diffusion coefficient greater than that of the seventh semiconductor region 220 are used, or thermal hysteresis is made to differ from that of the seventh semiconductor region 220. In the case that a mask differing from that of the seventh semiconductor region 220 is to be used, ion implantation of the eighth semiconductor region 321 needs to be performed in a range wider than that of the seventh semiconductor region 220.

As described above, in the photoelectric conversion apparatus according to the present embodiment, both a reduction in the shading due to electric potential variation of the semiconductor region arranged in a region below the channel of the amplifying MOS transistor and a reduction in leakage current are made possible. By reducing leakage current, the image quality is improved and image defects are reduced, thereby facilitating correction of the image. It is also possible to reduce the amount of memory required at correction time.

The contact 113 may be provided for each pixel (each photoelectric conversion unit), and may be provided for a plurality of pixels (photoelectric conversion units). In the case that one contact is provided for a unit of a plurality of pixels, a reference voltage needs only to be also supplied via the fifth semiconductor region 211 to the sixth semiconductor region 219 of the pixel where no contact is arranged. Furthermore, it is also possible to supply the reference voltage via the fourth semiconductor region 217. That is, the contact needs only to be formed in such a manner that the semiconductor regions 210, 217, and 220 are electrically connected to one another.

The arrangement of the contact 113 is not limited to the position shown in FIG. 6, and the contact 113 may be arranged at a position close to the amplifying MOS transistor 105 within the pixel. The contact 113 should preferably be arranged at a place in which the influence of incident light is comparatively small, which is in an active region where the photoelectric conversion unit is arranged.

Second Embodiment

Figure 2:
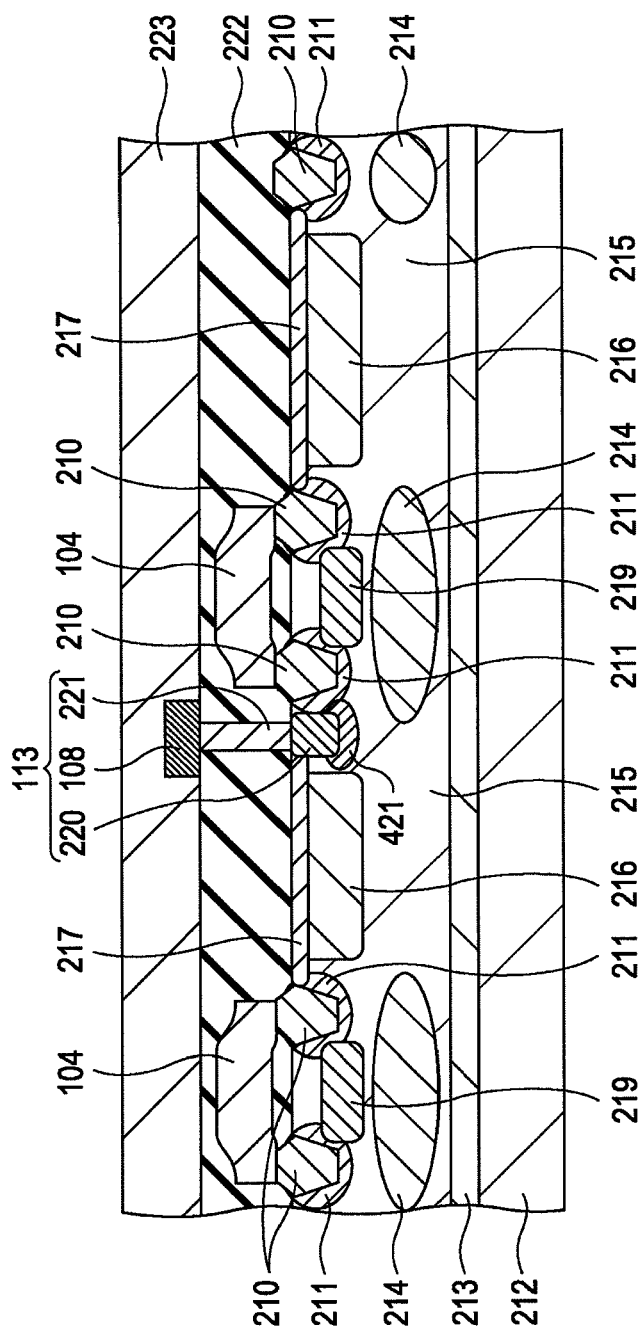
FIG. 2 is a cross-sectional view of a pixel of a photoelectric conversion apparatus according to a second embodiment of the present invention.

FIG. 2 is a cross-sectional view of a photoelectric conversion apparatus, which corresponds to the cross section AB in FIG. 6. Components identical to those of the first embodiment are designated with the same reference numerals, and descriptions thereof are omitted. In the present embodiment, a semiconductor region 421 that moderates an electric field between the third semiconductor region 216 and the seventh semiconductor region 220 is formed by the same step as that of the sixth semiconductor region 219.

The semiconductor region 421 and the sixth semiconductor region 219 which are formed by the same step and have the same concentration, and the impurity concentration thereof is lower than that of the seventh semiconductor region 220. With such a concentration relationship, similarly to the first embodiment, it is possible for the seventh semiconductor region 220 and the third semiconductor region 216 to form a PN junction via a semiconductor region having a low concentration without directly forming a PN junction. Furthermore, because it is not necessary to increase the number of steps for forming the semiconductor region 421, it is possible to improve the image quality while decreasing the cost of the product.

Furthermore, it is also possible to form the semiconductor region 421 and the sixth semiconductor region 219 in such a manner that they are continuous with each other in plan view. In this case, it is possible to fix the electric potential of the sixth semiconductor region 219 with low resistance, making it possible to further increase the shading suppression effect.

Third Embodiment

Figures 3A, 3B:
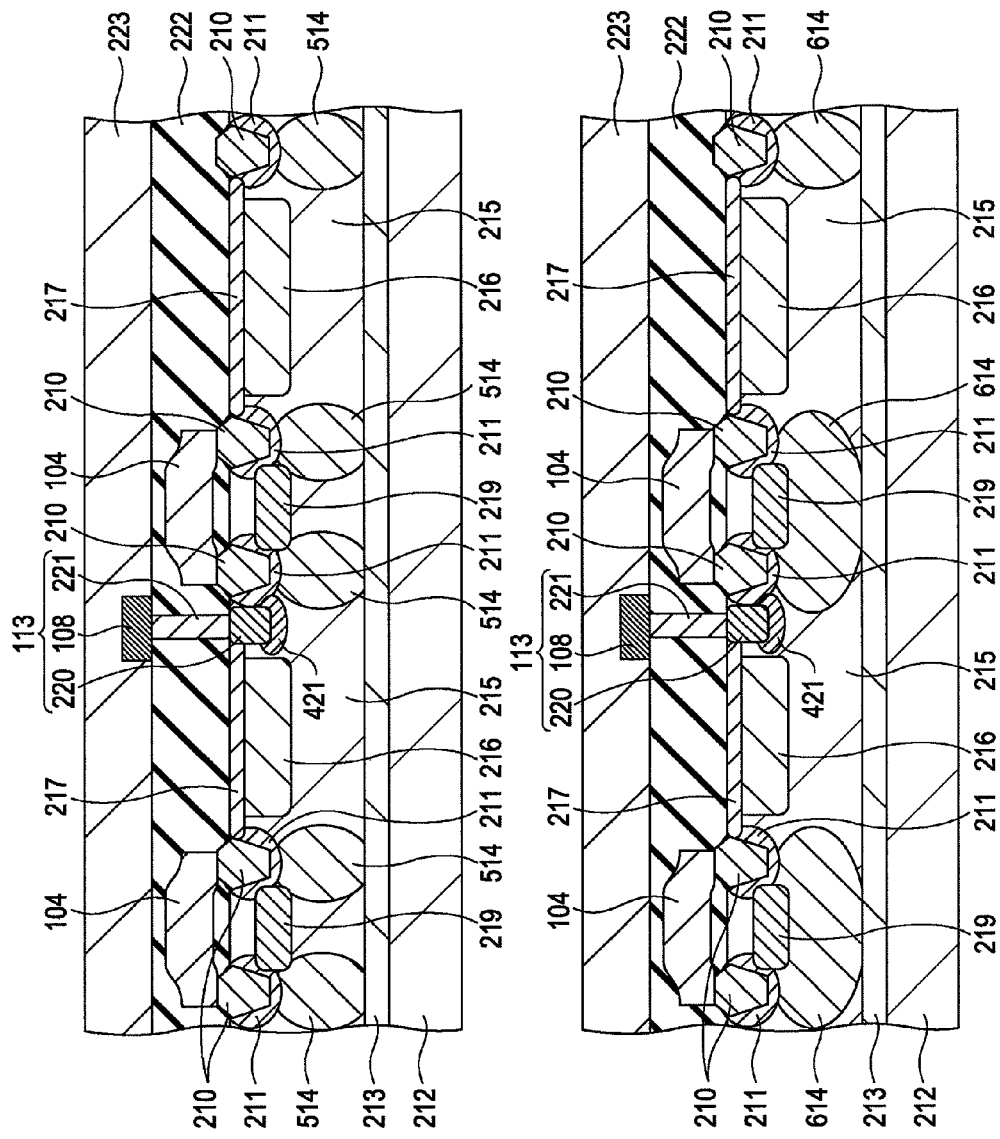
FIG. 3A is a cross-sectional view of a pixel of a photoelectric conversion apparatus according to a third embodiment of the present invention.
FIG. 3B is a cross-sectional view of a pixel of the photoelectric conversion apparatus according to the third embodiment of the present invention.

The present embodiment differs from the second embodiment in the structure of a semiconductor region used to isolate active regions of adjacent pixels or elements. FIGS. 3A and 3B are cross-sectional views of a photoelectric conversion apparatus, which corresponds to the cross section AB in FIG. 6. Components identical to those of the first and second embodiments are designated with the same reference numerals, and descriptions thereof are omitted. FIGS. 3A and 3B show mutually different modifications.

In FIG. 3A, a semiconductor region 514 is a semiconductor region used to isolate active regions of adjacent pixels or elements. The semiconductor region 514 is arranged at least in such a manner as to be in contact with the second semiconductor region 213. The semiconductor region 514 can be formed by ion implantation by using the same mask as that when the fifth semiconductor region 211 is formed.

In FIG. 3B, a semiconductor region 614 is a semiconductor region used to isolate active regions of adjacent pixels or elements. The semiconductor region 614 is arranged in such a manner as to be in contact with both the second semiconductor region 213 and the sixth semiconductor region 219.

In FIGS. 3A and 3B, the second semiconductor region 213 and the semiconductor region 514 or the semiconductor region 614 are brought into contact with each other, thereby being electrically connected to each other. By fixing the electric potential of the second semiconductor region 213 in the outer periphery of the pixel unit, it is possible to set the electric potential of the sixth semiconductor region 219 more stably in comparison with the second embodiment. In FIG. 3B, the second conduction-type semiconductor regions 211, 213, 217, 219, 220, and 614 are electrically connected to one another, making it possible to further decrease the resistance of the second conduction-type semiconductor region (forming a lower impedance). Because a second conduction-type semiconductor region is arranged in such a manner as to surround the photoelectric conversion unit, it is possible to further reduce leakage of signal charge to the adjacent pixels.

In the present embodiment, in addition to the advantages obtained by the second embodiment, the sensitivity is improved, and the electric potential of the second conduction-type sixth semiconductor region 219 can be set to the reference potential with a low impedance.

Fourth Embodiment

In the present embodiment, the arrangement of the contact 113 in a color photoelectric conversion apparatus will be described. Regarding contacts, the layout of the semiconductor region, and the like, the same structure as that of the first and third embodiments can be used. In the present embodiment, in a photoelectric conversion apparatus having primary color filters, a contact for supplying a voltage to a well is provided in a pixel where a blue filter is arranged.

In the pixel provided with a contact, because the photoelectric conversion unit has a contact when compared to another pixel, the sensitivity may be decreased because the amount of incident light is decreased, and the saturation level of the photoelectric conversion unit may also be decreased. Such variations in the sensitivity and the saturation level will be represented as noise in the image.

Here, a description will be given of the relationship between noise that occurs in a pixel corresponding to each color in a photoelectric conversion apparatus having primary color filters and an image. In the case that noise occurs in a pixel corresponding to a green filter, the noise is conspicuous because human beings have a high visual sensitivity to green in comparison with blue and red. In the case that noise occurs in a pixel corresponding to a red filter, because the saturation level (dynamic range) is decreased, it is difficult to reproduce subtle gradation for, for example, a painting of a sunset. In the case that noise occurs in a pixel where a blue filter is arranged, peculiarities in sensitivity and saturation do not become conspicuous, and an influence of image deterioration can be reduced.

Therefore, by providing a contact for supplying a voltage to a well in a pixel where a blue filter is arranged, peculiarities in sensitivity and saturation do not become conspicuous, and an influence of image deterioration can be reduced. Furthermore, it is also possible to reduce the amount of correction.

Fifth Embodiment

Figure 5:
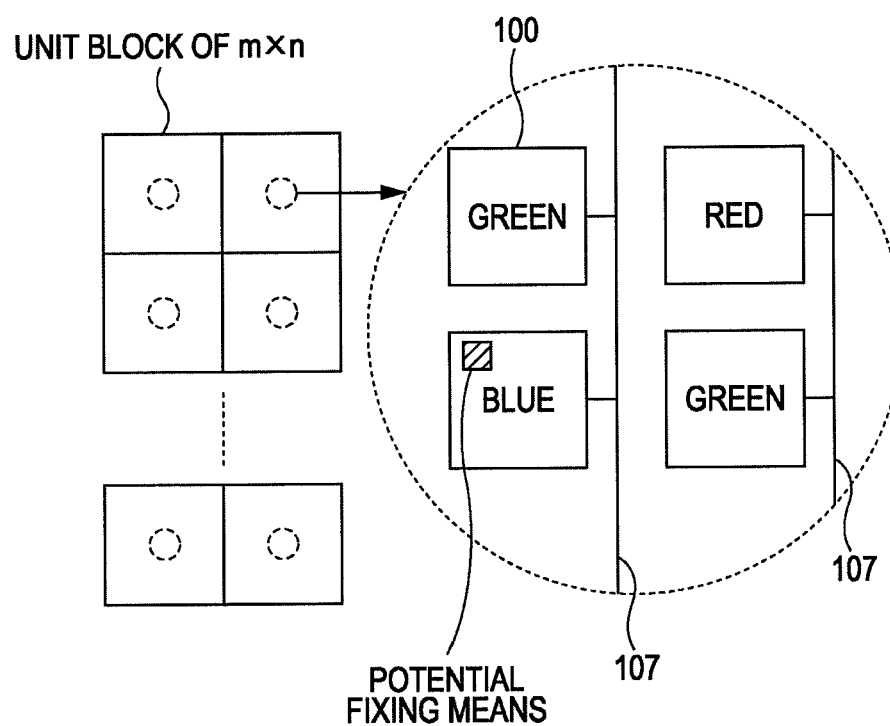
FIG. 5 is a schematic view of a photoelectric conversion apparatus according to a fifth embodiment of the present invention.

In the present embodiment, a description will be given of a layout in the case that a contact for supplying a voltage to one well for each unit block formed of a plurality of pixels 100 is arranged. FIG. 5 shows m×n pixels as one unit block. One contact is arranged for each unit block. That is, the contact is arranged sporadically in the pixel unit. With such a configuration, it is possible to minimize the number of pixels in which variations in the sensitivity and the saturation level may occur.

In a plurality of photoelectric conversion units in the unit block, it is preferable that a second conduction-type semiconductor region (for example, the fourth semiconductor region 217 in FIG. 1) forming the photoelectric conversion unit be arranged continuously with the second conduction-type semiconductor region (for example, the fourth semiconductor region 217 in FIG. 1) of the photoelectric conversion unit of an adjacent pixel. The reason for this is that, in this case, it is easy to supply a reference voltage to adjacent pixels via the semiconductor region of the second conduction-type.

Next, the arrangement period of contacts will be described. First, parasitic capacitance and parasitic resistance occur in each semiconductor region of the second conduction-type semiconductor region (211, 213, 217, 219, 220, and 214) arranged in the pixel unit. It takes a predetermined time (depends on the time constant) until the reference level is reached after the electric potential of the second conduction-type semiconductor region is varied. At this point, in order to increase m and n, the total impedance of a plurality of second conduction-type semiconductor regions connected to the reference voltage needs only to be decreased. A description will be given of a case in which, for example, the variation amount (or the variation amount of the signal line potential) of the output of the amplifying MOS transistor 105 due to potential variations of the sixth semiconductor region 219 is desired to be smaller than or equal to 1 mV. If a circuit gain until a signal is output is denoted as G1, the maximum value of the variation of the channel potential of the MOS transistor of the pixel 100 is denoted as A, and the time required for the potential variation to return from the maximum value A to smaller than or equal to 1 mV is denoted as t, $$A \times \exp(-t/RC) < 1 \text{ mV}/G1 \quad \text{(Expression 1)}.$$

Based on Expression 1, $$1/RC > \ln(1 \text{ mV}/(A \times \exp(t) \times G1)) \quad \text{(Expression 2)}$$

where ln is a natural logarithm, and RC is the time constant of the second conduction-type semiconductor region of the unit block of m×n pixels.

The number of pixels of the unit block can be determined as desired in such a range in which (Expression 2) is satisfied. When, for example, A=150 mV, G1=0.9, RC=0.2×10$^{-6}$ sec (RC=2×10$^{-12}$ per pixel), and T=1 µsec, one potential fixing means needs only to be provided in units of 100×100 pixels. The number of pixels of the unit block may be determined in advance, and then RC may be set and T may be set.

As described above, by forming contacts at a predetermined period, the number of pixels where variations in the sensitivity saturation level occur is decreased. Furthermore, as shown in the expanded portion of FIG. 5, it is possible to improve image quality by providing a contact in a pixel where a blue filter is arranged. In the present embodiment, correction of sensitivity and saturation can be facilitated more than in the fourth embodiment.

Sixth Embodiment

In the photoelectric conversion apparatus according to the first to fifth embodiments, a signal of one photoelectric conversion unit is output from an amplifying transistor. However, in the present embodiment, one amplifying MOS transistor is shared among a plurality of photoelectric conversion units (not shown in figures). Such a unit including a plurality of photoelectric conversion units and one amplifying MOS transistor is referred to as a unit cell. With such a configuration, the region that the transistor occupies in the pixel is reduced, making it possible to increase the region of the photoelectric conversion unit or decrease the pixel size. An element isolation region may not be provided among a plurality of photoelectric conversion units within the unit cell, and the fourth semiconductor region may be provided over a plurality of photoelectric conversion units.

Applications to Imaging System

As an application example of the photoelectric conversion apparatus described in the first to sixth embodiments, a case in which the photoelectric conversion apparatus is applied to an imaging system, such as a digital still camera or a camcorder, will be described. In the present embodiment, a case in which the photoelectric conversion apparatus is used for a digital still camera as an imaging system will be described.

Figure 8:
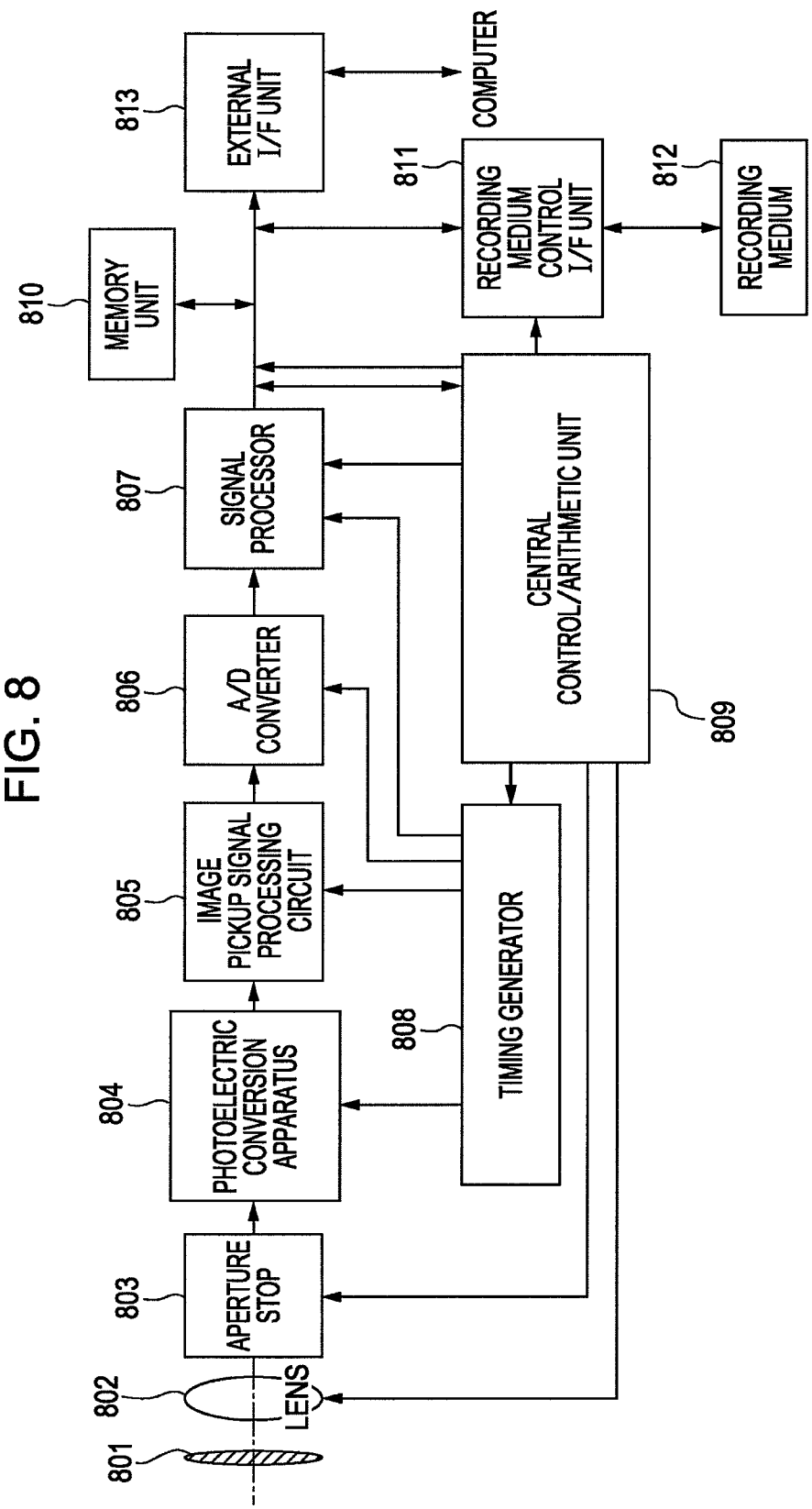
FIG. 8 is a block diagram showing a configuration of an imaging system.

FIG. 8 is a block diagram of a digital still camera. An optical image of a subject is formed as an image on the image-capturing plane of a photoelectric conversion apparatus 804 by means of an optical system including a lens 802 and the like. In a portion outside the lens 802, a barrier 801 serving both the protect function of the lens 802 and a main switch may be provided. The lens 802 may be provided with an aperture stop 803 for adjusting the amount of light transmitted therefrom. Image pickup signals output through a plurality of channels from the photoelectric conversion apparatus 804 are subjected to processing, such as various corrections and clamping, performed by an image pickup signal processing circuit 805. The image pickup signals output through a plurality of channels from the image pickup signal processing circuit 805 are converted from analog to digital form by an A/D converter 806. Various kinds of corrections, data compression and the like are performed on the image data output from the A/D converter 806 by a signal processor (e.g., an image processor) 807. The photoelectric conversion apparatus 804, the image pickup signal processing circuit 805, the A/D converter 806, and the signal processor 807 operate in accordance with a timing signal generated by a timing generator 808.

The image pickup signal processing circuit 805, the A/D converter 806, the signal processor 807, and the timing generator 808 may be formed on the same chip as the photoelectric conversion apparatus 804. Each block is controlled by a central control/arithmetic unit 809. In addition, the imaging system includes a memory unit 810 for temporarily storing image data, and a recording medium control interface unit 811 for recording or reading images on or from a recording medium 812. The recording medium 812 is configured to include, for example, a semiconductor memory, and can be loaded or unloaded therefrom. The imaging system may further include an external interface (I/F) unit 813 for performing communication with an external computer.

Next, the operation of the imaging system shown in FIG. 8 will be described. In response to the opening of the barrier 801, the main power-supply, the power supply of a control system, and the power supply of an image-capturing system circuit, such as an A/D converter 806, are switched on in sequence. Thereafter, in order to control the amount of exposure, the central control/arithmetic unit 809 opens the aperture stop 803. A signal output from the photoelectric conversion apparatus 804 passes through the image pickup signal processing circuit 805 and is provided to the A/D converter 806. The A/D converter 806 converts the signal from analog to digital form and outputs it to the signal processor 807. The signal processor 807 processes the obtained data and provides it to the central control/arithmetic unit 809. The central control/arithmetic unit 809 then performs a computation for determining the amount of exposure. The central control/arithmetic unit 809 controls the aperture stop on the basis of the determined amount of exposure.

Next, the central control/arithmetic unit 809 extracts high frequency components from the signal output from the photoelectric conversion apparatus 804 and processed by the signal processor 807, and computes a distance up to the subject on the basis of the high frequency components. Thereafter, the central control/arithmetic unit 809 drives the lens 802 and determines whether or not an in-focus state is reached. When it is determined that an in-focus state is not reached, the lens 802 is driven again, and the distance is computed.

Then, after the in-focus state is confirmed, actual exposure starts. When the exposure is completed, the image pickup signal output from the photoelectric conversion apparatus 804 is subjected to correction and the like by the image pickup signal processing circuit 805, is subjected to A/D conversion by the A/D converter 806, and is processed by the signal processor 807. The image data processed by the signal processor 807 is stored in the memory unit 810 by the central control/arithmetic unit 809.

Thereafter, the image data stored in the memory unit 810 is recorded on the recording medium 812 via the recording medium control I/F unit 811 under the control of the central control/arithmetic unit 809. Furthermore, the image data can be provided to a computer and the like through the external I/F unit 813, whereby the image data is processed.

It is possible to provide an imaging system in which corrections in an image pickup signal processing circuit, an A/D converter, a signal processor and the like at subsequent stages are easy or unnecessary, and therefore, high-speed image capturing is possible.

Although the present invention has been described with reference to exemplary embodiments, it is to be understood that the invention is not limited to the disclosed exemplary embodiments, and the conduction type may be reversed, and the embodiments may be combined with one another. The scope of the following claims is to be accorded the broadest interpretation so as to encompass all modifications and equivalent structures and functions.

This application claims the benefit of Japanese Application No. 2008-046241 filed Feb. 27, 2008, which is hereby incorporated by reference herein in its entirety.

What is claimed is:

1. A photoelectric conversion apparatus comprising:
a first semiconductor region of the first conduction type;
a second semiconductor region of a second conduction type arranged above the first semiconductor region;
a third semiconductor region of the second conduction type having an impurity concentration higher than an impurity concentration of the second semiconductor region, arranged above the second semiconductor region;
a fourth semiconductor region of the first conduction type arranged above the third semiconductor region;
a fifth semiconductor region of the first conduction type arranged so as to surround the third semiconductor region;
an amplifying transistor for reading out signals from a photoelectric conversion unit;
a sixth semiconductor region of the first conduction type arranged below a gate electrode of the amplifying transistor;
a plug for supplying a reference voltage to the sixth semiconductor region;
a seventh semiconductor region of the first conduction type, which is arranged below the plug so as to be in contact with the plug and electrically connected to each of the forth semiconductor region, the fifth semiconductor region, the sixth semiconductor region and the first semiconductor region, and
an eighth semiconductor region of the first conduction type, having an impurity concentration lower than an impurity concentration of the seventh semiconductor region, and arranged between the seventh semiconductor region and the third semiconductor region.

2. The photoelectric conversion apparatus according to claim 1, wherein the impurity concentration of the eighth semiconductor region is lower than an impurity concentration of the forth semiconductor region.

3. The photoelectric conversion apparatus according to claim 1, further comprising a transistor, wherein the sixth semiconductor region extends from a region below the gate electrode of the amplifying transistor to a region below a gate electrode of the transistor.

4. The photoelectric conversion apparatus according to claim 1, wherein an ion seed of the seventh semiconductor region and an ion seed of the eight semiconductor region are different.

5. The photoelectric conversion apparatus according to claim 1, wherein the fifth semiconductor region extends to a region below the sixth semiconductor region.

6. The photoelectric conversion apparatus according to claim 1, wherein the third semiconductor region is among a plurality of third semiconductor regions, and wherein the forth semiconductor region extends towards the plurality of third semiconductor regions.

\* \* \* \* \*